United States Patent
Li et al.

(10) Patent No.: US 7,652,257 B2
(45) Date of Patent: Jan. 26, 2010

(54) STRUCTURE OF A SOLID STATE PHOTOMULTIPLIER

(75) Inventors: Wen Li, Clifton Park, NY (US); Scott Stephen Zelakiewicz, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 11/763,550

(22) Filed: Jun. 15, 2007

(65) Prior Publication Data
US 2008/0308738 A1     Dec. 18, 2008

(51) Int. Cl.
*G01T 1/24* (2006.01)

(52) U.S. Cl. .............................. 250/370.01
(58) Field of Classification Search ............ 250/370.01
See application file for complete search history.

(56) References Cited

U.S. PATENT DOCUMENTS

| | | | |
|---|---|---|---|
| 2005/0148166 A1* | 7/2005 | Lin et al. | 438/622 |
| 2005/0184291 A1* | 8/2005 | Cole et al. | 257/59 |

FOREIGN PATENT DOCUMENTS

| | | | |
|---|---|---|---|
| EP | 1755171 A1 * | 2/2007 | |
| WO | WO 2007023401 A1 * | 3/2007 | |

OTHER PUBLICATIONS

W(illem). J(ohannes). Kindt, "Geiger Mode Avalanche Photodiode Arrays For Spatially Resolved Single Photon Counting," Ph.D. Thesis, Copyright 1999, Delft University Press, Delft, The Netherlands, ISBN 90-407-1845-8.*
N. Otte et al., "Prospects of Using Silicon Photomultipliers for the Astroparticle Physics Experiments EUSO and Magic," IEEE Transactions on Nuclear Science, vol. 53, No. 2, Apr. 2006.
J. C. Jackson et al., "Toward integrated single-photon-counting microarrays," 2003 Society of Photo-Optical Instrumentation Engineers, Optical Engineering, vol. 42 No. 1, pp. 112-118, Jan. 2003.
Willem Johannes Kindt, "Geiger Mode Avalanche Photodiode Arrays," Delft University Press, Section 6.5, 1999.

* cited by examiner

*Primary Examiner*—Constantine Hannaher
(74) *Attorney, Agent, or Firm*—Jason K. Klindtworth

(57) ABSTRACT

A solid-state photomultiplier (SSPM) includes an optical isolation structure therein. The SSPM includes a substrate and an epitaxial diode layer positioned on the substrate. A plurality of avalanche photodiodes (APDs) are fabricated on the epitaxial diode layer and the optical isolation structure is positioned about the plurality of APDs to separate each of the plurality of APDs from adjacent APDs. The optical isolation structure contains at least one of a light absorbing material and a light reflecting material deposited therein to reduce optical crosstalk and dark count rate in the SSPM.

19 Claims, 6 Drawing Sheets

STRUCTURE OF A SOLID STATE PHOTOMULTIPLIER

BACKGROUND OF THE INVENTION

The present invention relates generally to radiographic detectors for imaging and, more particularly, to a solid-state photomultiplier (SSPM) structure with improved crosstalk and dark count rate characteristics.

Typically, in radiographic imaging systems, such as x-ray and computed tomography (CT), an x-ray source emits x-rays toward a subject or object, such as a patient or a piece of luggage. Hereinafter, the terms "subject" and "object" may be interchangeably used to describe anything capable of being imaged. The x-ray beam, after being attenuated by the subject, impinges upon an array of radiation detectors. The intensity of the attenuated radiation received at the detector array is typically dependent upon the attenuation of the x-rays. Each detector element of the detector array produces a separate electrical signal indicative of the attenuated beam received by each detector element. The electrical signals are transmitted to a data processing system for analysis which ultimately produces an image.

As an example, conventional CT imaging systems utilize detectors that convert radiographic energy into current signals that are integrated over a time period, then measured and ultimately digitized. A drawback of such detectors however is their inability to provide data or feedback as to the number and/or energy of photons detected. During image reconstruction, data as to the number and/or energy of photons detected can be used to distinguish materials which appear identical in images reconstructed from conventional systems that do not provide this additional information. That is, conventional CT detectors have a scintillator component and a photodiode component wherein the scintillator component illuminates upon reception of radiographic energy and wherein the photodiode detects illumination of the scintillator component and provides an electrical signal as a function of the intensity of illumination. These detectors, however, are unable to provide energy discriminatory data or otherwise count the number and/or measure the energy of photons actually received by a given detector element or pixel. That is, the light output of the scintillator is proportional to the energy deposition in the scintillator, which is a function of the number of x-rays impinged as well as the energy level of each of the x-rays. Under the charge integration operation mode, the photodiode is not capable of discriminating between the energy level or the count of X-rays received by the scintillator. For example, two scintillators may illuminate with equivalent light intensity and, as such, provide equivalent output to their respective photodiodes. Yet, the number of x-rays received by each scintillator may be different as well as the x-rays' energy, but overall yield an equivalent light output.

In attempts to design scintillator-based detectors capable of X-ray photon counting and energy discrimination, detectors constructed from scintillators coupled to a solid-state photomultiplier (SSPM) have been employed. The SSPM is comprised of a plurality of Geiger-mode avalanche photodiodes (APDs) or "microcells" that amplify each single optical photon from the scintillator into a large and fast signal current pulse. When coupled with a fast scintillator material having a rapid photon decay time, SSPM based detectors can provide a photon counting, energy discriminating CT detector that does not saturate at the x-ray flux rate range typically found in conventional CT systems. An SSPM also provides a high gain with low associated noise that is highly desirable when performing photon counting and energy discrimination.

The benefits set forth above make the use of an SSPM in a detector desirable for numerous reasons; however, there are varying problems that affect current SSPM designs. Typically, SSPMs are constructed with the plurality of Geiger-mode APDs built on a single layer silicon wafer with no isolation structures positioned therebetween. Such a construction allows for optical crosstalk between APDs. That is, a small amount of light is emitted when current flows through a reverse-biased diode, as is the case when an avalanche is initiated in an APD due to the absorption of an incident photon. Because the emitted light has a peak emission of approximately 650 nm, it can travel relatively long distances in silicon before it is absorbed. When the emitted light is absorbed, it can trigger additional avalanche events, which also cause light emission. The final result can be a large number of APDs avalanching for a single photon incident on the device, thus resulting in optical crosstalk.

Conventionally, optical crosstalk between APDs is controlled by maintaining a minimum distance between adjacent APD cells. Such a mechanism for controlling optical crosstalk is only somewhat effective, and additionally, results in a loss of active area in the SSPM. That is, the spacing between adjacent APDs limits the fill factor of the active area of the SSPM and makes it difficult to design APD cell size smaller than approximately 30 microns without substantial active area loss.

Another issue with current SSPM designs is the potentially high dark count rate resulting from the whole bulk of the silicon wafer substrate. That is, a single layer silicon wafer substrate design in an SSPM can result in high diffusion dark leakage, thus adding to the overall dark count rate.

It would therefore be desirable to design a solid state photomultiplier that effectively addresses the problem of optical crosstalk between adjacent APDs. It would be further desirable to design a SSPM that reduces the dark count rate.

BRIEF DESCRIPTION OF THE INVENTION

The present invention overcomes the aforementioned drawbacks by providing a solid-state photomultiplier with improved optical crosstalk and dark count rate characteristics. The SSPM includes an optical isolation structure therein that isolates each of a plurality of avalanche photodiode (APD) cells from adjacent APD cells. The optical isolation structure contains a light absorbing material deposited therein.

According to one aspect of the present invention, a solid state photomultiplier includes a substrate, an epitaxial diode layer positioned on the substrate, and a plurality of avalanche photodiodes (APDs) fabricated on the epitaxial diode layer. The solid state photomultiplier also includes an optical isolation structure positioned about the plurality of APDs to separate each of the plurality of APDs from adjacent APDs, wherein the optical isolation structure contains at least one of a light absorbing material and a light reflecting material deposited therein.

According to another aspect of the present invention, a method of manufacturing a solid-state photomultiplier includes the steps of forming a semiconductor substrate, placing an epitaxial layer on the semiconductor substrate, and positioning a plurality of avalanche photodiodes (APDs) on the epitaxial layer. The method also includes the steps of etching a plurality of isolation trenches into the epitaxial layer to isolate each APD in the plurality of APDs and filling the plurality of isolation trenches with at least one of a light absorbing material and a light reflecting material.

According to yet another aspect of the present invention, a detector module includes a scintillator configured to absorb ionizing radiation and convert the ionizing radiation into optical photons and a solid-state photomultiplier (SSPM) coupled to the scintillator, the SSPM configured to receive the optical photons and to convert the optical photons into corresponding electrical signals. The SSPM further comprises a heterostructure substrate having a base substrate and an epitaxial substrate, an array of microcells positioned on the epitaxial substrate, and an isolation trench grid formed in the epitaxial substrate and separating adjacent microcells in the array of microcells, wherein the isolation trench grid includes at least one of a light absorbing material and a light reflecting material therein.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

The present invention is directed to radiographic detectors for imaging and, more particularly, to a solid-state photomultiplier (SSPM) structure with improved crosstalk and dark count rate characteristics. The SSPM can be integrated into any number of radiographic detection devices, including gamma spectrometers/isotope identifiers, neutron detectors, computed tomography systems, and positron emission tomography (PET) systems.

Figure 1:
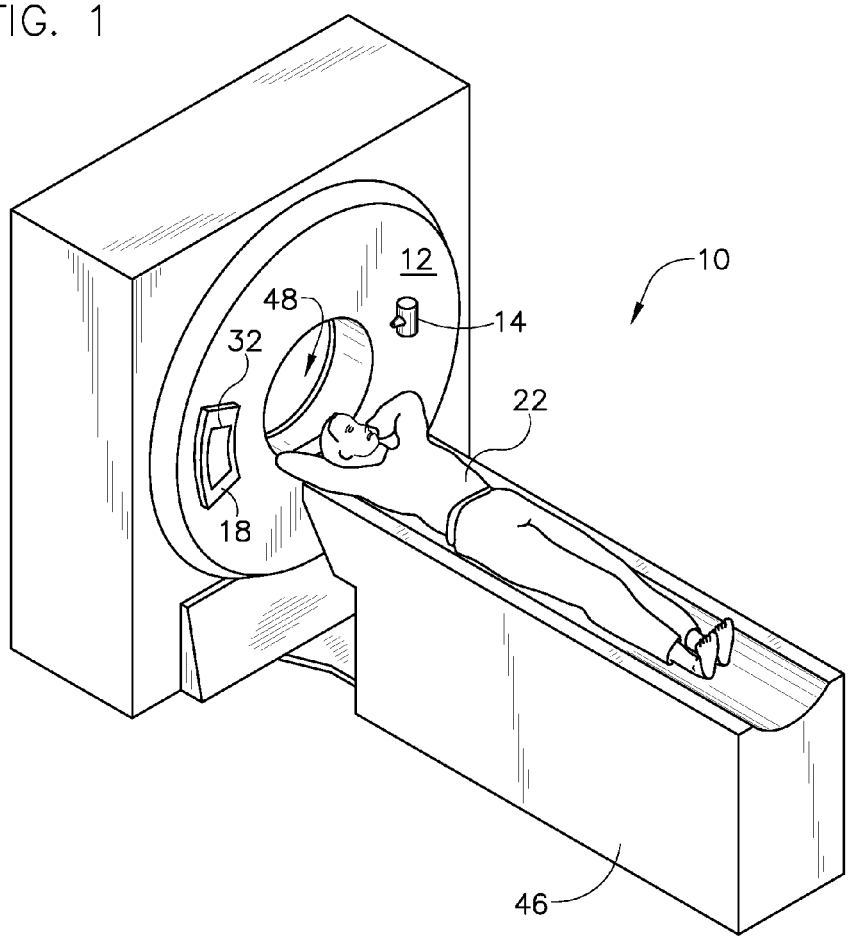
FIG. 1 is a pictorial view of a CT imaging system.
Figure 2:
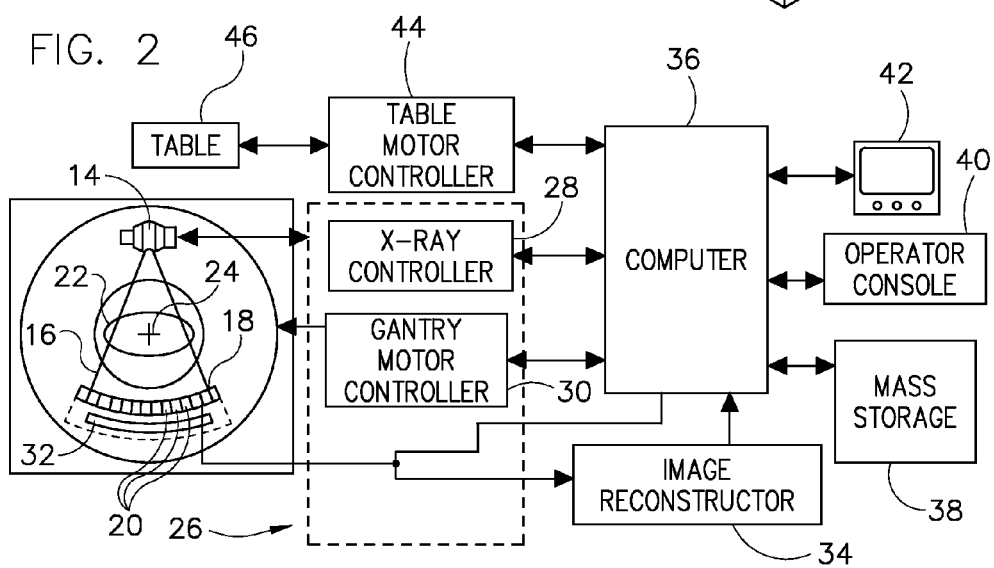
FIG. 2 is a block schematic diagram of the system illustrated in FIG. 1.

In accordance with one aspect of the present invention, a CT imaging system is provided. The CT imaging system includes a detector constructed to perform photon counting and energy discrimination of x-rays at the high flux rates generally associated with CT imaging. Referring to FIGS. 1 and 2, a computed tomography (CT) imaging system 10 is shown as including a gantry 12 representative of a "third generation" CT scanner. Gantry 12 has an x-ray source 14 that projects a beam of x-rays 16 toward a detector assembly 15 on the opposite side of the gantry 12. The detector assembly 15 includes therein a collimator assembly 18, a plurality of detector modules 20, and data acquisition systems (DAS) 32. In one embodiment, detector assembly 15 includes fifty-seven detector modules 20, with each detector module 20 having an array size of 64×16 of pixel elements. As a result, detector assembly 15 has 64 rows and 912 columns (16×57 detectors) which allows 64 simultaneous slices of data to be collected with each rotation of gantry 12. The plurality of detector modules 20 sense the projected x-rays that pass through a medical patient 22, and DAS 32 converts the data to digital signals for subsequent processing. Each detector module 20 in a conventional system produces an analog electrical signal that represents the intensity of an impinging x-ray beam and hence the attenuated beam as it passes through the patient 22. During a scan to acquire x-ray projection data, gantry 12 and the components mounted thereon rotate about a center of rotation 24.

Rotation of gantry 12 and the operation of x-ray source 14 are governed by a control mechanism 26 of CT system 10. Control mechanism 26 includes an x-ray controller 28 that provides power and timing signals to an x-ray source 14 and a gantry motor controller 30 that controls the rotational speed and position of gantry 12. An image reconstructor 34 receives sampled and digitized x-ray data from DAS 32 and performs high speed reconstruction. The reconstructed image is applied as an input to a computer 36 which stores the image in a mass storage device 38.

Computer 36 also receives commands and scanning parameters from an operator via console 40 that has a keyboard. An associated cathode ray tube display 42 allows the operator to observe the reconstructed image and other data from computer 36. The operator supplied commands and parameters are used by computer 36 to provide control signals and information to DAS 32, x-ray controller 28 and gantry motor controller 30. In addition, computer 36 operates a table motor controller 44 which controls a motorized table 46 to position patient 22 and gantry 12. Particularly, table 46 moves portions of patient 22 through a gantry opening 48 (i.e., bore).

Figure 3:
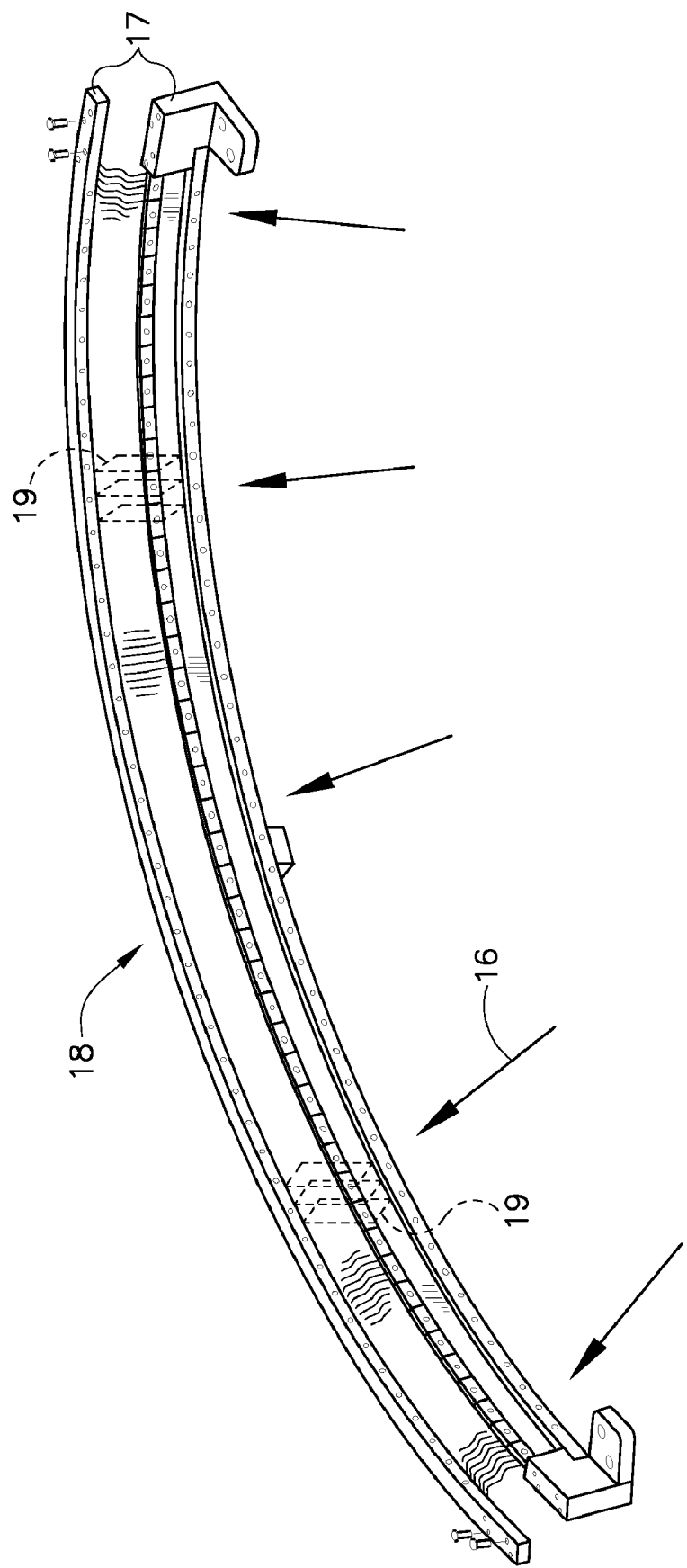
FIG. 3 is a perspective view of one embodiment of a collimator assembly.

As shown in FIG. 3, collimator assembly 18 includes rails 17 having collimating blades or plates 19 placed therebetween. Collimator assembly 18 is positioned in such a way so that x-rays 16 are collimated by the collimating blades 19 before such beams impinge upon the detector module 20 (shown in FIG. 2).

Figure 4:
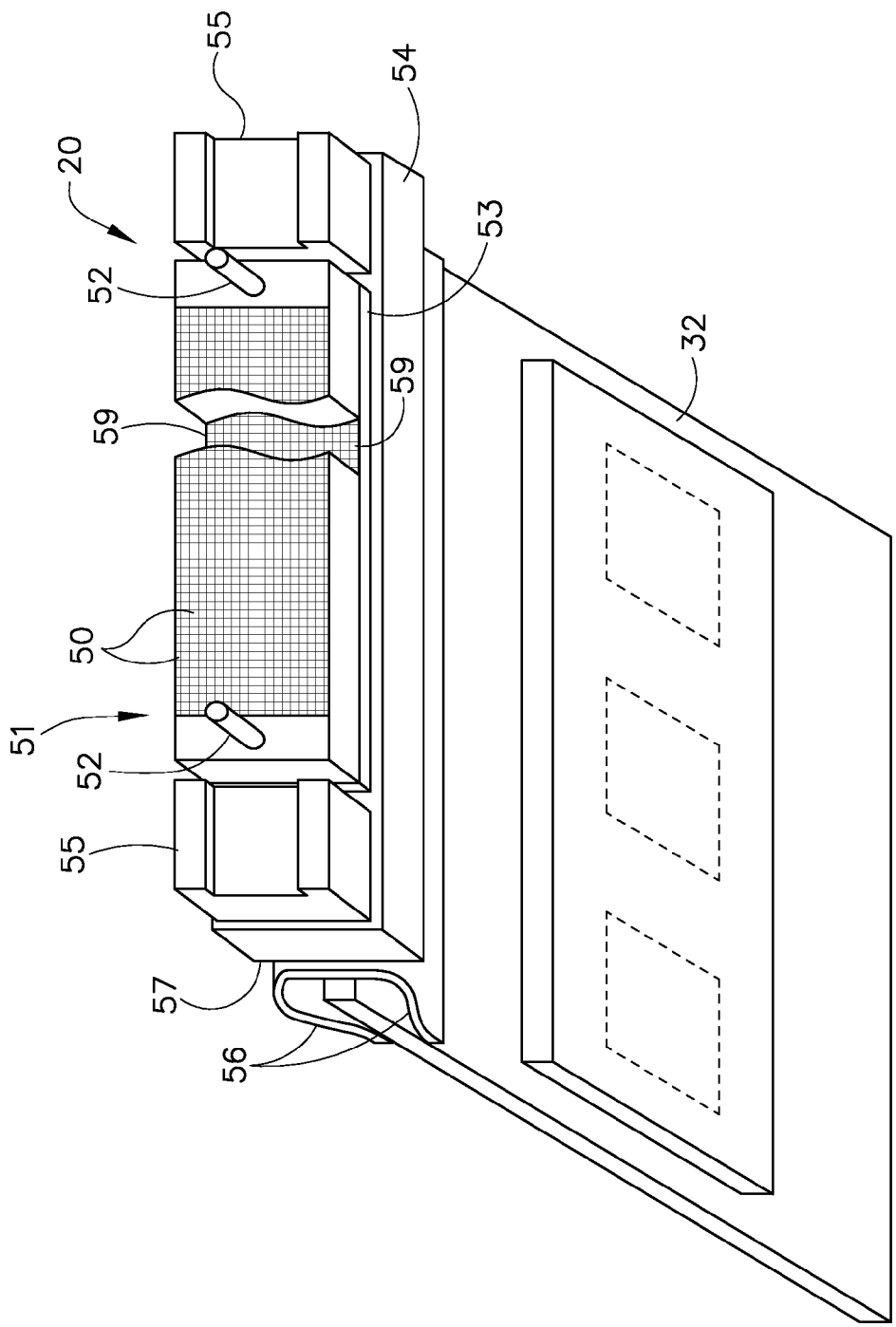
FIG. 4 is a perspective view of one embodiment of a detector module.

Referring now to FIG. 4, detector module 20 includes DAS 32 and is further comprised of a number of scintillator elements 50 arranged in pack 51. Detector module 20 includes pins 52 positioned within pack 51 relative to scintillator elements 50. Pack 51 is positioned on photosensor 53, which is in turn positioned on multi-layer substrate 54. Spacers 55 are positioned on multi-layer substrate 54. Scintillator elements 50 are optically coupled to photosensor 53, and photosensor 53 is in turn electrically coupled to multi-layer substrate 54. Flex circuits 56 are attached to face 57 of multi-layer substrate 54 and to DAS 32. Detector module 20 is positioned within collimator assembly 18 by use of pins 52.

In the embodiment of detector module 20 shown in FIG. 4, pack 51 includes pins 52, a scintillator 58, and a reflective material (not shown) positioned between individual scintillator elements 50, (i.e., pixel elements) that form scintillator 58. Scintillator 58 is positioned to receive impinging x-rays 16 and generate light photons responsive thereto. The light photons traverse scintillator 58 and are received by a solid-state photosensor 53 (i.e., a solid-state photomultiplier (SSPM)), which converts the light photons into analog electrical signals. The analog signal generated is carried through a multi-layer substrate 54 to DAS 32, wherein the analog signal is converted to a digital signal.

Figure 5:
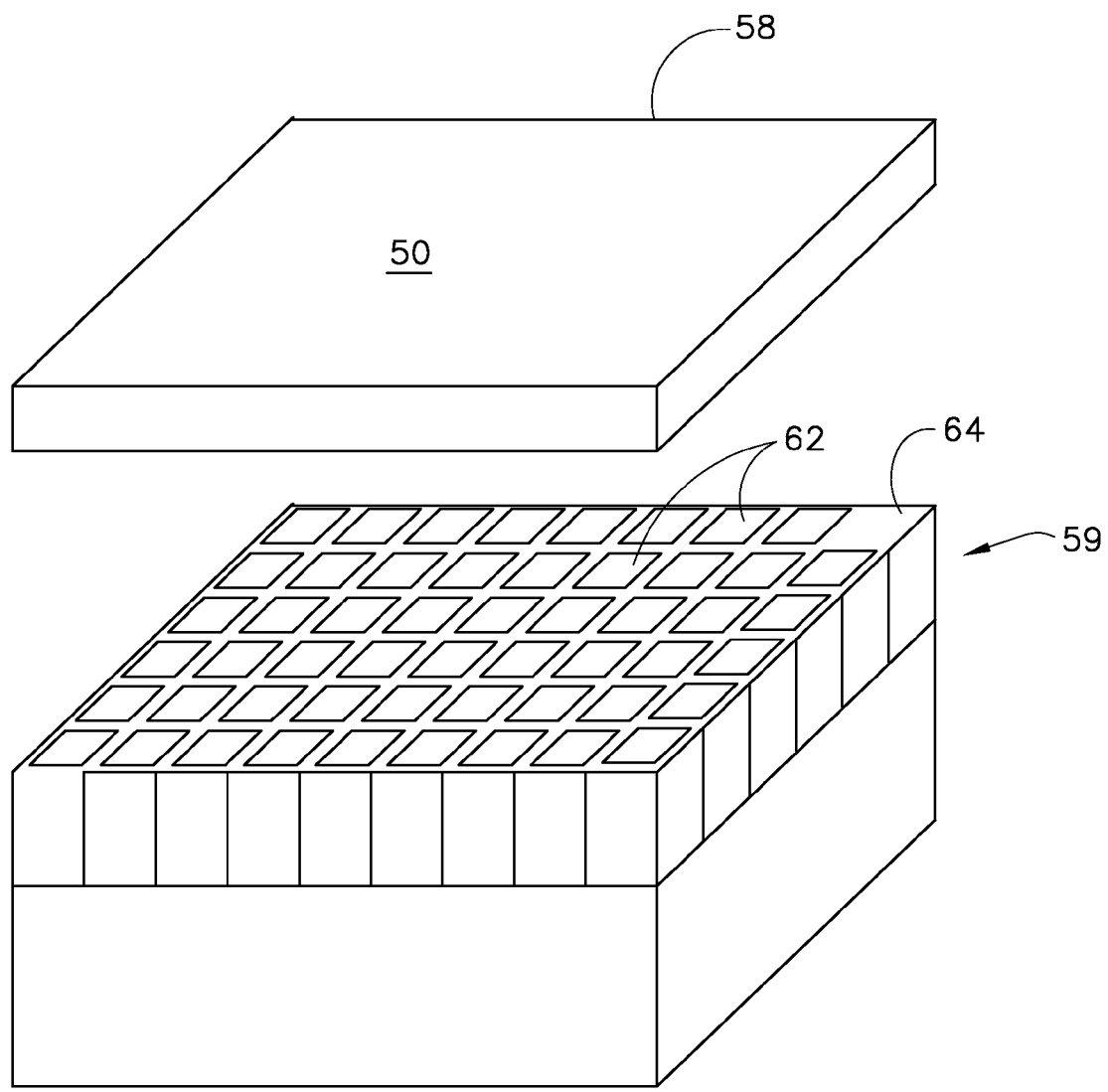
FIG. 5 is a perspective view of a detector pixel according to the current invention.

SSPM 53 is comprised of a plurality of macroscopic units referred to as pixels 59. The number of pixels 59 on the SSPM 53 should be sufficient to cover an area of the detector module 20 and correspond to the pixelated scintillator 58 and the pixel elements 50 thereon, although the exact number and density of the pixels 59 will be determined by image resolution desired by an operator and other known factors. A portion of a pixel 59 is shown in FIG. 5 as being comprised of a plurality of avalanche photodiodes (APDs) or "microcells" 62 that amplify single optical photon arrivals from the scintillator 58 into a large signal. Typically, each pixel 59 will contain between 100 to 2500 APDs per mm$^2$, with each of the microcells 62 having a length of 20-100 microns. Each of the microcells 62 operates as an individual Geiger-mode APD a few volts above a breakdown voltage, with each microcell 62 being virtually identical to all the other microcells. In this mode of operation, an electron generated by the absorption of an optical photon initiates an avalanche breakdown that is confined to an individual microcell 62 when the one or more photons is absorbed by that microcell. A single discrete unit of electrical charge is emitted from the microcell 62 independent of the number of photons absorbed therein. That is, for each Geiger breakdown, the output signal of the microcell 62 will have the same shape and charge, except for small variations due to differences from cell to cell introduced in the production process.

Figure 6:
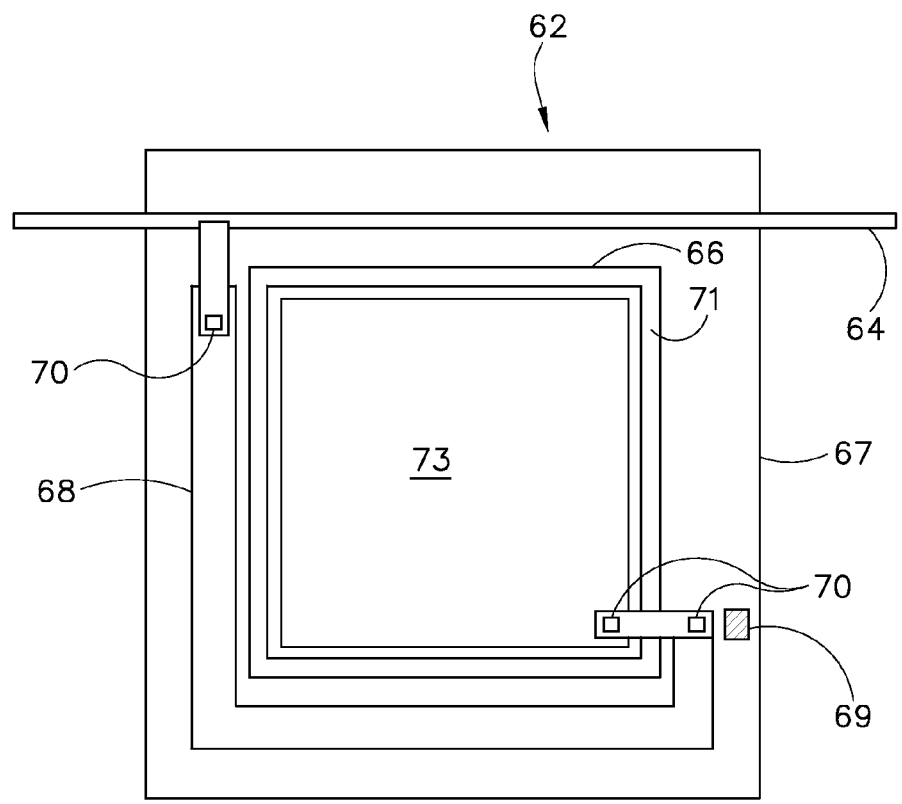
FIG. 6 is a top plan view of a microcell according to the current invention.
Figure 7:
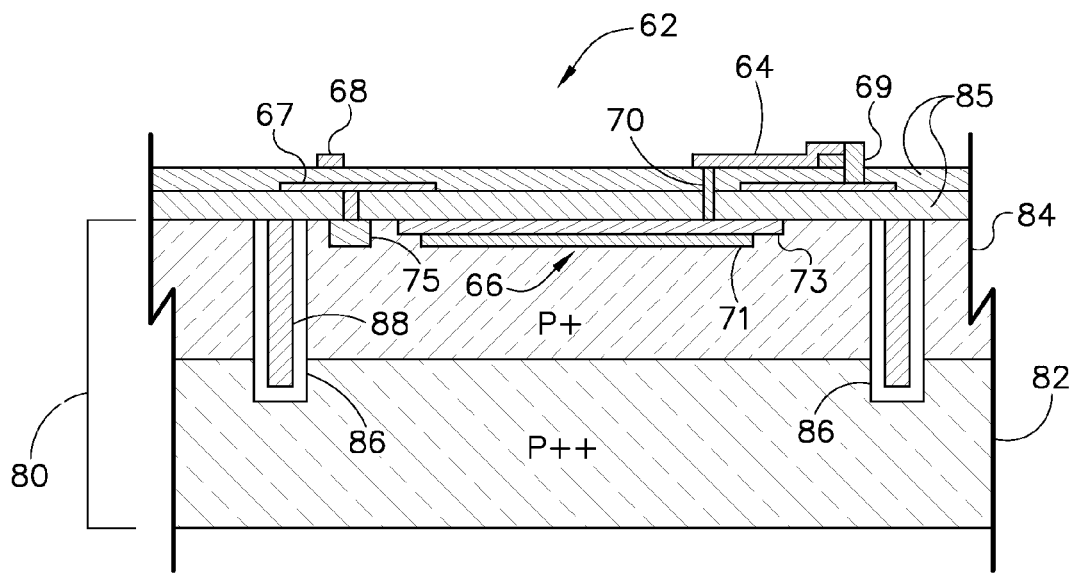
FIG. 7 is a side elevational view of the microcell of FIG. 6.

Each microcell 62 is connected to a conductive grid 64 on the front side of the pixel 59. In one embodiment, the conductive grid 64 is composed of aluminum, although other similar materials are also envisioned that are conductive and also, preferably, non-magnetic. As shown in FIGS. 6 and 7, each microcell 62 includes an active area silicon layer 66 surrounded by a metal light shield/cathode 67 that includes a cathode contact 69 thereon. While front side contacts are shown in FIGS. 6 and 7, the cathode contact 69 could also be made on the back side of the wafer or thru-vias could be used for both anode and cathode contacts to provide back side connections. The active area 66 is comprised of a P+ anode 71 and an N implant 73 to convert optical photons into a corresponding electrical signal. The active area 66 is, in part, separated from the remainder of microcell 62 by an N+ guard 75.

Connection between active area 66 of each microcell 62 and the conductive grid 64 is formed by way of a resistor 68, composed of polysilicon in one embodiment. The resistor 68 is connected to the active area 66 of microcell 62 by way of vias 70 and functions to limit the current transferred from the microcell 62 to the conductive grid 64. The resistor 68 also serves to quench the avalanche in the microcell 62 once the cell capacitance discharges. By way of resistors 68 and conductive grid 64, the independently operating APD cells 62 are electrically connected and the individual outputs of all the microcells 62 are summed to form a common readout signal. The common readout signal that is output from the pixel 59, shown in FIG. 5, is thus the superposition of the standardized signals of all fired microcells 62. That is, the output of each pixel 59 of FIG. 5 is determined by the sum of the discrete electrical charge units from the microcells 62 that fire. As such, the output of the pixel 59 of FIG. 5 is dependent on the number of microcells 62 that absorb a photon rather than the number of photons absorbed by each microcell 62. Under operation conditions in which the number of absorbed photons is below the number of microcells, the resulting output from each pixel 59 is in the form of an analog pulse with a charge that is proportional to the number of absorbed photons.

As shown in FIG. 7, each microcell 62 in the SSPM is formed in part by a heterostructure substrate 80 that includes a base substrate 82 and an epitaxial diode layer 84 (i.e., epitaxial substrate). A silicon dioxide film 85 is also deposited on heterostructure substrate 80 and acts as an electrical insulator that is positioned on the epitaxial diode layer 84 to electrically insulate the plurality of microcells 62. The base substrate 82 is formed of a heavily doped, low resistivity semiconductor material, such as silicon, as is designated by P++ designation in FIG. 7. The epitaxial diode layer 84 can be grown on the base substrate 82 and is formed of a more lightly doped, high-resistivity semiconductor material (i.e., P−) having a lattice structure and orientation identical to that of the base substrate 82. In another embodiment, a silicon to silicon bonding process can be used to apply the epitaxial diode layer 84 to achieve the heterostructure substrate 80. Preferably, epitaxial diode layer 84 has a thickness of about 10-20 micrometers, although it is envisioned that other thicknesses are also possible. The epitaxial diode layer 84 helps to reduce the dark count rate (i.e., the number of dark current induced events per second) in the microcell 62 by eliminating microdefects and reducing diffusion dark leakage from the bulk of the heterostructure substrate 80.

To reduce optical crosstalk, the active area 66 in microcell 62 is isolated from an active area in an adjacent microcell by way of an optical isolation structure 86. In addition, the optical isolation structure 86 will also reduce the diffusion current from adjacent microcells. The reduction in the optical crosstalk and diffusion current will limit undesired discharges of the microcell 62 and thus lower the dark count rate and/or after pulses. That is, optical isolation structure 86 functions to minimize optical crosstalk and dark diffusion leakage current between active areas 66 in adjacent microcells 62. By a combination of the epitaxial diode layer 84 and the optical isolation structure, dark count rate in the microcells 62 can be suppressed by upwards of a factor of ten.

In one embodiment, and as shown in FIG. 7, the optical isolation structure is in the form of a 2D isolation trench 86. The isolation trench 86 is etched or cut into epitaxial diode layer 84 to form an isolation trench grid that isolates each individual APD cell 62 from adjacent APD cells in the array of microcells of pixel 59 (shown in FIG. 5). More specifically, an isolation trench 86 is positioned about the active area 66 of each microcell 62. As shown, isolation trench 86 extends down through epitaxial diode layer 84 and down into base substrate 82 and has a depth of about 10-25 micrometers, although the depth can vary depending on the thickness of the epitaxial diode layer 84.

Also shown in FIG. 7 is a material 88 that is deposited into isolation trench grid 86 that is comprised of either a light absorbing material or a light reflecting material. The material 88 fills isolation trench 86 to block photon crosstalk between active areas 66 in adjacent microcells 62. The material 88 can preferably be composed of a heavily doped polysilicon, a black dyed organic material, or a metal, although other suitable materials are also envisioned as being used. The reduction in optical crosstalk provided by isolation trench grid 86 allows for active area 66 to be increased in size in microcells 62. That is, the distance between active areas 66 in adjacent microcells 62 can be reduced due to the crosstalk protection provided by isolation trench grid 86. This in turn also allows for microcell 62 to be minimized in size down to a range of about thirty micrometers (i.e., 30 μm) or less, while maintaining a significant ratio of active area to dead area. Thus, a pixel 59 (shown in FIG. 5) can be designed to have a greater fill factor of microcells 62.

Figure 8:
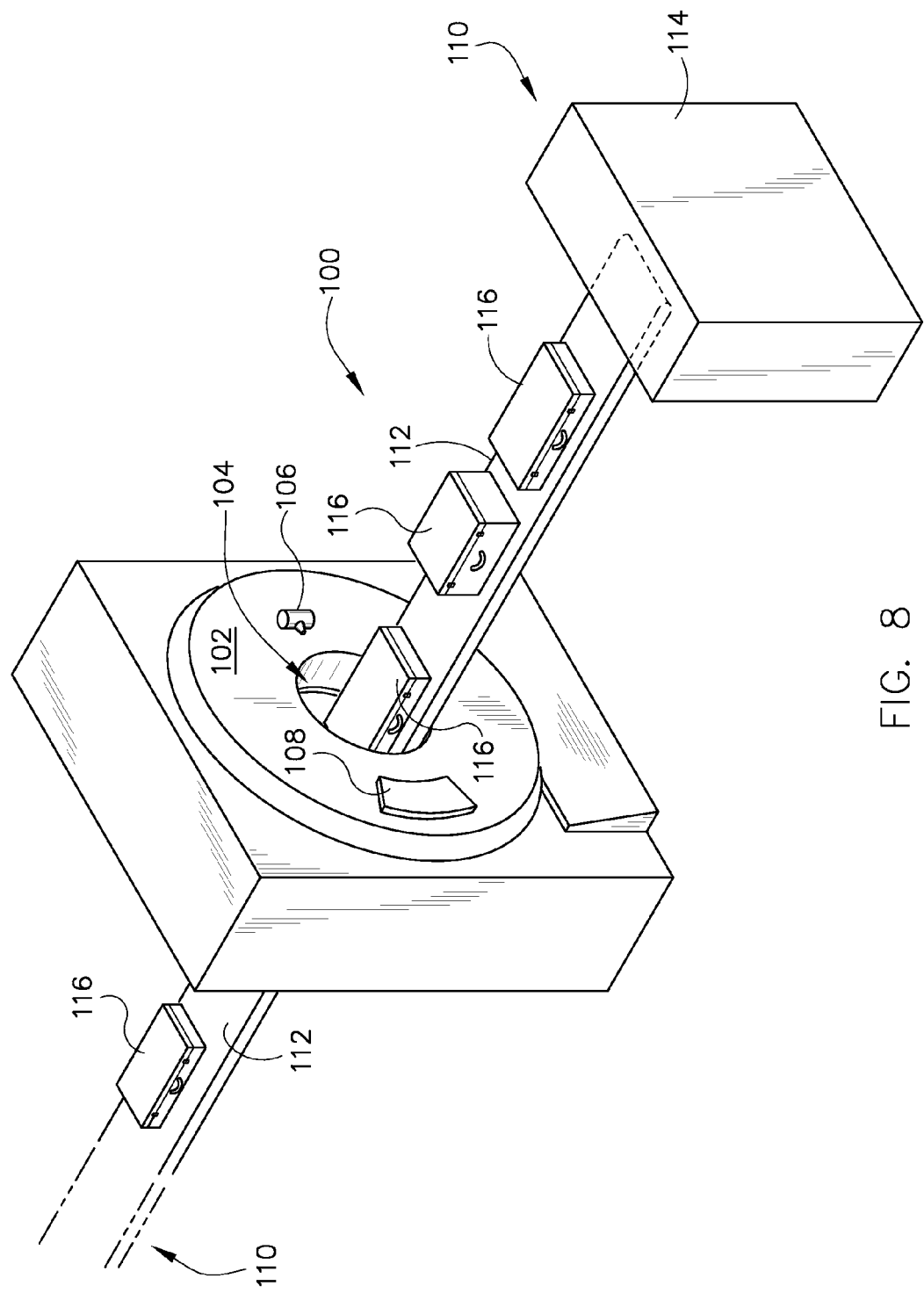
FIG. 8 is a pictorial view of a CT system for use with a non-invasive package inspection system.

The SSPM structure set forth above can be integrated into other radiographic detection devices other than the CT medical imaging system 10 shown in FIG. 1. Referring now to FIG. 8, a package/baggage inspection system 100 is shown that incorporates the described SSPM. Package/baggage inspection system 100 includes a rotatable gantry 102 having an opening 104 therein through which packages or pieces of baggage may pass. The rotatable gantry 102 houses a high frequency electromagnetic energy source 106 as well as a detector assembly 108 having a scintillator and a SSPM as shown in FIGS. 4-7. A conveyor system 110 is also provided and includes a conveyor belt 112 supported by structure 114 to automatically and continuously pass packages or baggage pieces 116 through opening 104 to be scanned. Objects 116 are fed through opening 104 by conveyor belt 112, imaging data is then acquired, and the conveyor belt 112 removes the packages 116 from opening 104 in a controlled and continuous manner. As a result, postal inspectors, baggage handlers, and other security personnel may non-invasively inspect the contents of packages 116 for explosives, knives, guns, contraband, etc.

The SSPM having the structure set forth above in FIGS. 4-7 can also be integrated into other radiographic detection devices, including gamma spectrometers/radioactive isotope identifiers, neutron detectors, and other handheld devices, or also positron emission tomography (PET) systems.

Therefore, according to one embodiment of the invention, a solid state photomultiplier includes a substrate, an epitaxial diode layer positioned on the substrate, and a plurality of avalanche photodiodes (APDs) fabricated on the epitaxial diode layer. The solid state photomultiplier also includes an optical isolation structure positioned about the plurality of APDs to separate each of the plurality of APDs from adjacent APDs, wherein the optical isolation structure contains at least one of a light absorbing material and a light reflecting material deposited therein.

According to another embodiment of the invention, a method of manufacturing a solid-state photomultiplier includes the steps of forming a semiconductor substrate, placing an epitaxial layer on the semiconductor substrate, and positioning a plurality of avalanche photodiodes (APDs) on the epitaxial layer. The method also includes the steps of etching a plurality of isolation trenches into the epitaxial layer to isolate each APD in the plurality of APDs and filling the plurality of isolation trenches with at least one of a light absorbing material and a light reflecting material.

According to yet another embodiment of the invention, a detector module includes a scintillator configured to absorb ionizing radiation and convert the ionizing radiation into optical photons and a solid-state photomultiplier (SSPM) coupled to the scintillator, the SSPM configured to receive the optical photons and to convert the optical photons into corresponding electrical signals. The SSPM further comprises a heterostructure substrate having a base substrate and an epitaxial substrate, an array of microcells positioned on the epitaxial substrate, and an isolation trench grid formed in the epitaxial substrate and separating adjacent microcells in the array of microcells, wherein the isolation trench grid includes at least one of a light absorbing material and a light reflecting material therein.

The present invention has been described in terms of the preferred embodiment, and it is recognized that equivalents, alternatives, and modifications, aside from those expressly stated, are possible and within the scope of the appending claims.

What is claimed is:

1. A solid state photomultiplier comprising:
   a base substrate;
   an epitaxial diode layer positioned on the base substrate;
   a plurality of avalanche photodiodes (APDs) fabricated on the epitaxial diode layer;
   an optical isolation structure positioned about an active area in each of the plurality of APDs, the optical isolation structure configured as an isolation trench containing at least one of a light absorbing material and a light reflecting material; and
   a silicon dioxide layer film deposited on the plurality of active areas, on the at least one of a light absorbing material and on a light reflecting material, and the optical isolation structure.

2. The solid state photomultiplier of claim 1 wherein each of the plurality of APDs further comprises an active area silicon layer.

3. The solid state photomultiplier of claim 1 wherein the optical isolation structure is configured as a grid whereby each of the active areas is isolated from adjacent active areas.

4. The solid state photomultiplier of claim 3 wherein the isolation trench grid is formed in the epitaxial diode layer.

5. The solid state photomultiplier of claim 3 wherein the isolation trench grid is configured to have a depth between 10-25 micrometers.

6. The solid state photomultiplier of claim 1 wherein the epitaxial diode layer is configured to have a thickness between 10-20 micrometers.

7. The solid state photomultiplier of claim 1 wherein the plurality of APDs form at least one pixel.

8. The solid state photomultiplier of claim 7 further comprising a conductive grid configured to combine electrical charges generated by the plurality of APDs and output a single electrical signal from each of the least one pixels.

9. The solid state photomultiplier of claim 1 wherein the plurality of APDs are configured to operate in Geiger-mode.

10. The solid state photomultiplier of claim 1 wherein the base substrate comprises a doped semiconductor material, and wherein the epitaxial diode layer comprises a doped semiconductor material having a lighter doping than the doping of the semiconductor material of the base substrate.

11. The solid state photomultiplier of claim 1 further comprising a silicon dioxide film positioned on the epitaxial diode layer to electrically insulate the plurality of APDs.

12. The solid state photomultiplier of claim 1 wherein the optical isolation structure comprises at least one of a doped polysilicon material and an organic material filling the optical isolation structure.

13. A method of manufacturing a solid-state photomultiplier comprising the steps of:
   forming a semiconductor substrate;
   placing an epitaxial layer on the semiconductor substrate;
   positioning a plurality of avalanche photodiodes (APDs) on the epitaxial layer;
   etching a plurality of isolation trenches into the epitaxial layer to isolate each APD in the plurality of APDs;
   filling the plurality of isolation trenches with at least one of a light absorbing material and a light reflecting material; and
   depositing a silicon dioxide film on the epitaxial layer, the APDs, on the at least one of a light absorbing material and a light reflecting material, and on the plurality of isolation trenches.

14. The method of claim 13 wherein the step of etching comprises etching a depth of the plurality of isolation trenches to a depth between 10-25 micrometers.

15. The method of claim 13 wherein the step of etching comprises etching the plurality of isolation trenches about an active area layer on each APD in the plurality of APDs.

16. The method of claim 13 wherein the step of placing comprises placing an epitaxial diode layer on the semiconductor substrate having a thickness between 10-20 micrometers.

17. A detector module comprising:
a scintillator configured to absorb ionizing radiation and convert the ionizing radiation into optical photons; and
a solid-state photomultiplier (SSPM) coupled to the scintillator, the SSPM configured to receive the optical photons and to convert the optical photons into corresponding electrical signals, the SSPM including:
 a heterostructure substrate having a base substrate and an epitaxial substrate;
 an array of microcells positioned on the epitaxial substrate an isolation trench grid formed in the epitaxial substrate and separating adjacent microcells in the array of microcells, the isolation trench grid filled with at least one of a light absorbing material and a light reflecting material; and
 a silicon dioxide layer covering the array of microcells, the at least one of a light absorbing material and a light reflecting material, and the isolation trench grid.

18. The detector module of claim 17 wherein the isolation trench grid is configured to have a depth between 10-25 micrometers.

19. The detector module of claim 17 wherein the epitaxial diode layer is configured to have a thickness between 10-20 micrometers.

* * * * *

UNITED STATES PATENT AND TRADEMARK OFFICE
CERTIFICATE OF CORRECTION

PATENT NO. : 7,652,257 B2 Page 1 of 1
APPLICATION NO. : 11/763550
DATED : January 26, 2010
INVENTOR(S) : Li et al.

It is certified that error appears in the above-identified patent and that said Letters Patent is hereby corrected as shown below:

In Column 9, Lines 10-11, in Claim 17, delete "substrate" and insert -- substrate; --, therefor.

In Column 9, Line 11, in Claim 17, delete "an isolation trench grid formed in the epitaxial" and insert the same in line 12, before "substrate" as a continuation.

Signed and Sealed this

Ninth Day of March, 2010

David J. Kappos
*Director of the United States Patent and Trademark Office*